(12) United States Patent
Har et al.

(10) Patent No.: US 8,513,819 B2
(45) Date of Patent: Aug. 20, 2013

(54) LOW LOOP WIRE BONDING

(75) Inventors: Liew Siew Har, Ipoh (MY); Law Wai Ling, Ipoh (MY)

(73) Assignee: Carsem (M) SDN. BHD., Ipoh (MY)

( * ) Notice: Subject to any disclaimer, the term of this patent is extended or adjusted under 35 U.S.C. 154(b) by 0 days.

(21) Appl. No.: 13/563,015

(22) Filed: Jul. 31, 2012

(65) Prior Publication Data

US 2013/0062765 A1 Mar. 14, 2013

(30) Foreign Application Priority Data

Sep. 9, 2011 (MY) .............................. PI 2011004279

(51) Int. Cl.
*H01L 23/48* (2006.01)
*H01L 23/52* (2006.01)
*H01L 29/40* (2006.01)

(52) U.S. Cl.
USPC ........... 257/784; 257/777; 257/779; 257/780; 257/786; 438/106; 438/108; 438/118; 438/123; 438/127; 174/260; 174/267; 361/773; 361/774; 228/180.5; 228/110.1; 228/1.1; 228/4.5; 219/56.21; 219/56.22

(58) Field of Classification Search
USPC .................................. 257/784; 438/118, 119
See application file for complete search history.

(56) References Cited

U.S. PATENT DOCUMENTS

| | | | |
|---|---|---|---|
| 5,989,995 A * | 11/1999 | Nishiura et al. | 438/617 |
| 6,112,974 A * | 9/2000 | Nishiura et al. | 228/180.5 |
| 6,222,274 B1 | 4/2001 | Nishiura et al. | |
| 6,380,634 B1 | 4/2002 | Umehara | |
| 6,426,563 B1 * | 7/2002 | Fujihira | 257/780 |
| 6,774,494 B2 * | 8/2004 | Arakawa | 257/779 |
| 7,810,695 B2 | 10/2010 | Park et al. | |
| 7,815,095 B2 * | 10/2010 | Fujisawa et al. | 228/180.5 |
| 2002/0117330 A1 * | 8/2002 | Eldridge et al. | 174/260 |
| 2003/0122265 A1 | 7/2003 | Baldonado et al. | |
| 2004/0041008 A1 | 3/2004 | Mochida | |
| 2006/0163331 A1 * | 7/2006 | Babinetz | 228/180.5 |
| 2006/0216863 A1 * | 9/2006 | Arakawa | 438/118 |
| 2008/0099895 A1 | 5/2008 | Kwak | |
| 2009/0189261 A1 | 7/2009 | Lim et al. | |
| 2010/0090330 A1 | 4/2010 | Nakazato | |
| 2010/0133677 A1 | 6/2010 | Murayama et al. | |

* cited by examiner

*Primary Examiner* — Ha Tran T Nguyen
*Assistant Examiner* — Thai T Vuong
(74) *Attorney, Agent, or Firm* — Kilpatrick Townsend & Stockton LLP (57) ABSTRACT

A multi-die package includes a first semiconductor die and a second semiconductor die each having an upper surface with a plurality of bond pads positioned thereon. The multi-die package also includes a plurality of bonding wires each coupling one of the bond pads on the upper surface of the first semiconductor die to a corresponding one of the bond pads on the upper surface of the second semiconductor die. A bonding wire of the plurality of bonding wires includes a first portion extending upward from one of the second plurality of bond pads substantially along a z-axis and curving outward substantially along x and y axes in a direction towards the first semiconductor die. The bonding wire also includes a second portion coupled to the first portion and extending from the first portion downward to one of the first plurality of bond pads on the upper surface of the first semiconductor die.

22 Claims, 12 Drawing Sheets

LOW LOOP WIRE BONDING

CROSS-REFERENCE TO RELATED APPLICATIONS

This application claims priority to Malaysian Patent Application No. PI 2011004279, filed Sep. 9, 2011, the disclosure of which is incorporated herein by reference in its entirety for all purposes.

BACKGROUND

The present invention relates in general to semiconductor packaging and, more particularly, to wire bonding between contacts that are positioned at substantially the same height or level in a semiconductor package.

An aspect of semiconductor packaging involves a wire bonding process. A conventional wire bonding process may use a conductive wire to connect a semiconductor die to a lead of a lead frame. This allows the semiconductor die to electrically communicate with external systems. The wire bonding process typically produces a loop in the conductive wire. A height of the loop determines a minimum allowable thickness of a semiconductor package.

Semiconductor packages are continually being designed to be more compact. This can be accomplished by using multi die packages, reducing thickness of the packages, and/or minimizing size of the packages. Loop height impacts each of these options.

Conventional methods of reducing loop height between contacts at different levels may include pulling the bonding wire downward. This increases stress in the bonding wire, however, and can lead to fracturing or cracking near ball bonds. Other methods include forming a folded loop in the bonding wire or forming a depression on a neck portion of the bonding wire. Quality of these methods is difficult to assess, however, and they generally reduce wire strength. One method that has been used with some success includes forming a first ball bond on a higher contact, then attaching a bonding wire to a lower contact using a ball bond, and then attaching the bonding wire to the higher contact using a stitch bond.

For contacts at the same height or level, the loop height is typically reduced by pulling the bonding wire downward. As explained above, this increases stress in the bonding wire and can lead to fracturing or cracking near ball bonds. The stress can be reduced by separating the contacts farther apart and lengthening the bonding wire. However, this increases lateral dimensions and size of the package. Other methods that have been used to reduce loop height when connecting contacts at different levels fail to provide the same benefit when used with contacts positioned at the same height or level.

Thus, there is a need to reduce loop height in bonding wires used to connect contacts that are positioned at the same height or level without increasing wire length.

SUMMARY

Embodiments of the present invention provide short and low loop wire bonding between contacts positioned at substantially the same height in a semiconductor package. For example, in accordance with an embodiment of the present invention, a multi-die package includes a die pad and a first semiconductor die positioned on the die pad. The first semiconductor die may include an upper surface having a first plurality of bond pads thereon. The multi-die package also includes a second semiconductor die positioned on the die pad. The second semiconductor die may include an upper surface having a second plurality of bond pads thereon. The upper surface of the second semiconductor die may be substantially coextensive with the upper surface of the first semiconductor die and extend substantially along a plane. The multi-die package also includes a plurality of bonding wires each coupling one of the first plurality of bond pads on the upper surface of the first semiconductor die to a corresponding one of the second plurality of bond pads on the upper surface of the second semiconductor die. A bonding wire of the plurality of bonding wires includes a first portion extending upward from one of the second plurality of bond pads substantially along a z-axis and curving outward substantially along x and y axes in a direction towards the first semiconductor die. The x-axis extends between the first semiconductor die and the second semiconductor die and the y-axis extends perpendicular to the x and z axes. The first portion of the bonding wire may be located substantially above the second semiconductor die. The bonding wire also includes a second portion coupled to the first portion and extending from the first portion downward to one of the first plurality of bond pads on the upper surface of the first semiconductor die.

In an embodiment, the second portion extends substantially straight from the first portion downward to one of the first plurality of bond pads on the upper surface of the first semiconductor die.

In another embodiment, the die pad comprises a first die pad and a second die pad, the first die pad laterally spaced from the second die pad, the first semiconductor die positioned on the first die pad and the second semiconductor die positioned on the second die pad.

In yet another embodiment, a first end of the bonding wire is bonded to a first ball bond using a wedge bond, the first ball bond positioned on one of the first plurality of bond pads on the upper surface of the first semiconductor die. A second end of the bonding wire may be bonded to one of the second plurality of bond pads on the upper surface of the second semiconductor die using a second ball bond.

In accordance with another embodiment of the present invention, a semiconductor package includes a first bond pad on a first upper surface and a second bond pad on a second upper surface. The first upper surface may be laterally spaced from and substantially coextensive with the second upper surface. The semiconductor package also includes a bonding wire having a first end and a second end. The first end of the bonding wire may be coupled to the first bond pad, and the second end of the bonding wire may be coupled to the second bond pad. The bonding wire includes a first portion extending upward from the second bond pad substantially along a z-axis and curving outward away from the second bond pad substantially along x and y axes in a direction towards the first bond pad. The x-axis extends between the first bond pad and the second bond pad and the y-axis extends perpendicular to the x and z axes. The first portion may be located substantially above the second upper surface. The bonding wire also includes a second portion coupled to the first portion and extending from the first portion downward to the first bond pad.

In an embodiment, the second portion extends substantially straight from the first portion downward to the first bond pad.

In another embodiment, the first portion is coupled to the second bond pad using a ball bond.

In yet another embodiment, the second portion is coupled to a ball bond positioned on the first bond pad using a wedge bond.

In accordance with yet another embodiment of the present invention, a method of coupling a first end of a bonding wire to a first bond pad and a second end of the bonding wire to a second bond pad includes forming a ball bond on the second bond pad using a portion of the bonding wire. The method also includes forming a first length of the bonding wire, where the first length is coupled to the ball bond and extends upward from the ball bond substantially along a z-axis and curves outward away from the ball bond substantially along x and y axes in a direction towards the first bond pad. The x-axis extends between the first bond pad and the second bond pad and the y-axis extends perpendicular to the x and z axes. The first length may be located substantially above the second semiconductor die. The method also includes forming a second length of the bonding wire coupled to the first length, where the second length extends from the first length downward to a first ball bond positioned on the first bond pad. The method also includes coupling the second length of the bonding wire to the first ball bond.

In an embodiment, the second length extends substantially straight from the first length downward to the first ball bond positioned on the first bond pad.

In another embodiment, the method also includes, prior to forming the ball bond on the second bond pad, forming the first ball bond on the first bond pad and tearing the bonding wire to separate the bonding wire from the first ball bond.

In accordance with yet another embodiment of the present invention, a wire bonding method in which a wire passing through a capillary is coupled to a first bond pad and to a second bond pad includes forming a ball bond on the second bond pad. Thereafter, while paying out a first length of the wire, the capillary is raised vertically upward substantially along a z-axis a first distance from the ball bond. Thereafter, the capillary is moved laterally substantially along a y axis a second distance in a direction away from the ball bond. An x-axis extends between the first bond pad and the second bond pad and the y-axis extends perpendicular to the x and z axes. Thereafter, the capillary is raised vertically upward substantially along the z-axis a third distance. Thereafter, the capillary is moved laterally substantially along the x axis a fourth distance in a direction towards the first bond pad. Thereafter, the capillary is raised vertically upward substantially along the z-axis a fifth distance. Thereafter, the capillary is moved laterally substantially along the y-axis a sixth distance in a direction towards the ball bond. Thereafter, the capillary is moved downward to the first bond pad and the wire is coupled to the first bond pad.

In an embodiment, forming the ball bond comprises melting an end of the wire using an electric flame off to form a free air ball.

In another embodiment, prior to forming the ball bond on the second bond pad, a first ball bond is formed on the first bond pad and the wire is torn to separate the wire from the first ball bond on the first bond pad.

In yet another embodiment, coupling the wire to the first bond pad comprises forming a wedge bond on the first ball bond.

Numerous benefits are achieved using embodiments of the present invention over conventional techniques. For example, in one embodiment a low loop bonding wire having a J-shape when viewed from above can be formed between two contacts that are at substantially the same height or level. The bonding wire may have a loop height of no more than about 50 µm above the contacts. This can reduce a minimum thickness of a semiconductor package. The J-shape can also reduce stress in the bonding wire. Depending on the embodiment, one or more of these benefits may exist. These and other benefits are described more fully below.

DETAILED DESCRIPTION

Embodiments of the present invention provide wire bonding between contacts that are positioned at substantially the same height or level in a semiconductor package. One or both of the contacts may be a bond pad on a semiconductor die, a bond pad on a substrate, a lead of a leadframe, or the like. In one embodiment, for example, the bonding wire connects a bond pad on a first semiconductor die with a bond pad on a second semiconductor die. The bonding wire may have a J-shape when viewed from above. Such a bonding wire can provide a lower loop height, a shorter wire length, and/or a reduced stress compared to conventional bonding wires.

Figure 1:
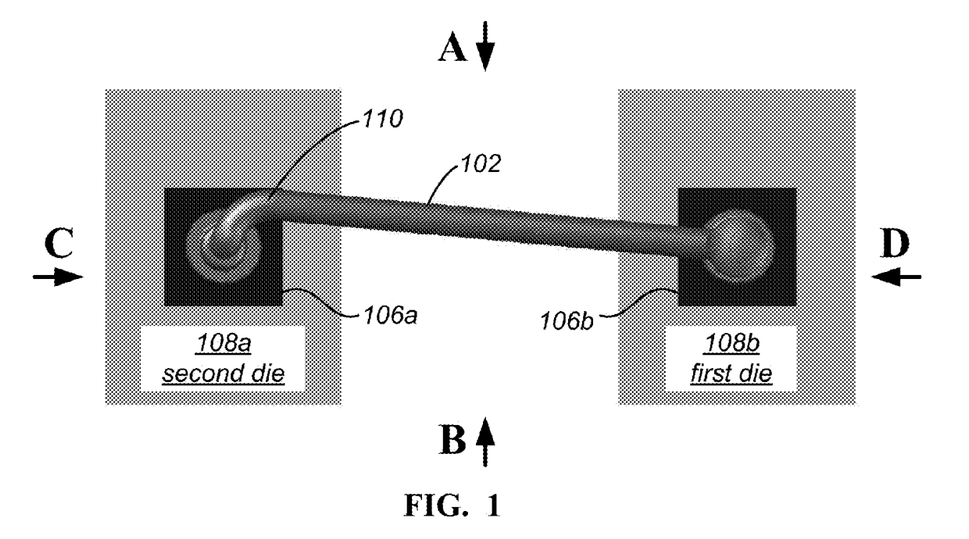
FIG. 1 is a simplified plan view of a bonding wire having a J-shape in accordance with an embodiment of the invention.

FIG. 1 is a simplified plan view of a bonding wire having a J-shape in accordance with an embodiment of the invention. The bonding wire electrically connects two surfaces that are at substantially the same height or level. The surfaces in this example may be upper surfaces of bond pads 106a, 106b and/or upper surfaces of semiconductor dies 108a, 108b. The arrangement shown in FIG. 1 may exist in an assembled semiconductor package that may also include an encapsulant material (not shown), or the arrangement may exist during a stage of assembly of a semiconductor package. Note that relative sizes and shapes of the features, including the bond pads 106a, 106b and the semiconductor dies 108a, 108b, are exaggerated for purposes of illustration.

As shown in FIG. 1, a bonding wire 102 extends between the bond pads 106a, 106b. As will be explained more fully below, the bonding wire 102 may be bonded to bond pad 106a using ball stitch bonding, and the bonding wire 102 may be bonded to bond pad 106b using ball stitch on ball (or wedge) bonding. In this example, the bonding wire 102 has a J-shape with a first portion that curves outward from the bond pad 106a to a bend 110. The bonding wire 102 also has a second portion that extends from the bend 110 the bond pad 106b. As shown in this example, the first portion is located substantially above the bond pad 106a, and the second portion extends substantially straight from the bend 110 to the bond pad 106b.

The shape of the bonding wire 102 reduces loop height by forming the bend 110 and J-shape mostly along a horizontal plane that is parallel with the upper surfaces of the bond pads 106a, 106b and/or the upper surfaces of the semiconductor dies 108a, 108a. A maximum height of the bonding wire 102 above the bond pads 106a, 106b is near the bend 110. In an embodiment, the maximum height of the bonding wire 102 above the upper surfaces of the bond pads 106a, 106b and/or the upper surfaces of the semiconductor dies 108a, 108b is no more than about 50 μm. The J-shape of the bonding wire 102 also reduces stress by limiting the downward pull at the bonds. The reduction in height and stress are achieved without increasing bonding wire length like conventional techniques.

The bonding wire 102 may comprise a number of conductive materials. In some embodiments, for example, the bonding wire 102 includes at least one of gold or copper. The bonding wire 102 may also be of any typical diameter. In some embodiments, for example, the bonding wire has a diameter of about 20 μm.

As would be appreciated by one of ordinary skill in the art, a semiconductor die may include a plurality of bond pads, and each bond pad may be electrically coupled to a corresponding bond pad of another semiconductor die or to a corresponding lead of a leadframe. Thus, a typically semiconductor package may include a plurality of bonding wires similar to the bonding wire 102 illustrated in FIG. 1.

Figure 2A:
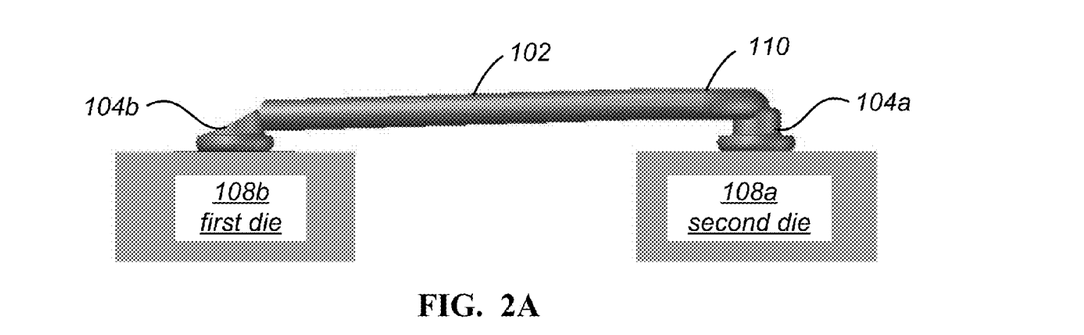
FIGS. 2A-2D are simplified side views of a bonding wire in accordance with an embodiment of the invention.
Figure 2B:
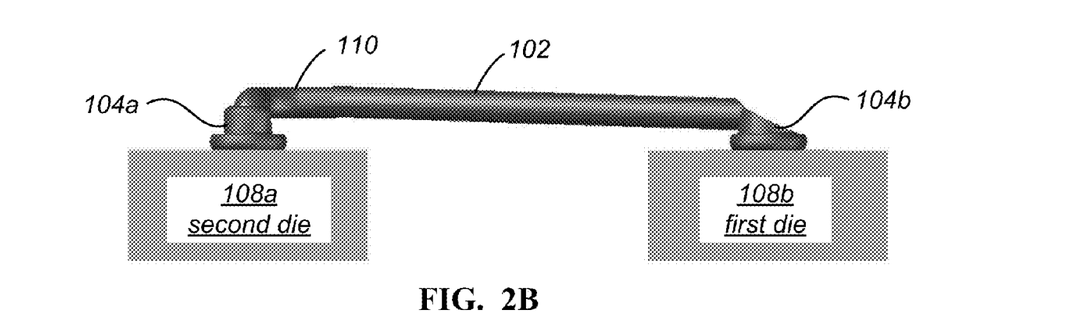

FIGS. 2A-2D are simplified side views of the bonding wire 102 in accordance with an embodiment of the invention. The view in FIG. 2A is from a perspective of point A shown in FIG. 1, and the view in FIG. 2B is from a perspective of point B shown in FIG. 1. From these perspectives, the bonding wire 102 extends between ball bonds 104a, 104b and connects the semiconductor dies 108a, 108b. The bond pads 106a, 106b are not visible in these figures. These figures show the first portion of the bonding wire 102 extending from the ball bond 104a to the bend 110, and the second portion of the bonding wire extending from the bend 110 downward to the ball bond 104b. A convex portion of the bend 110 is visible in FIG. 2A, and a concave portion of the bend 110 is visible in FIG. 2B. As can be seen in these figures, one end of the bonding wire may be bonded using ball stitch bonding, and the other end of the bonding wire 102 may be bonded using ball stitch on ball (or wedge) bonding.

Figure 2C:
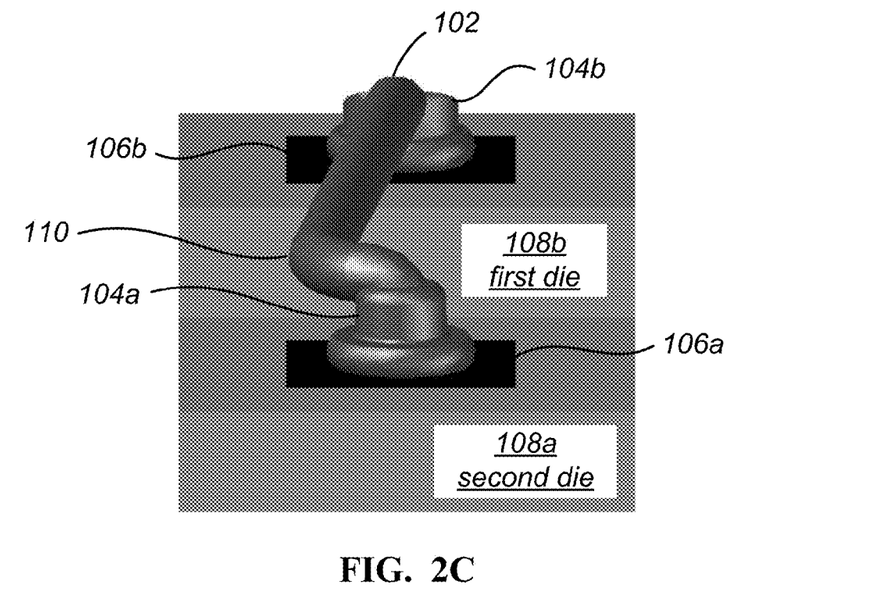
Figure 2D:
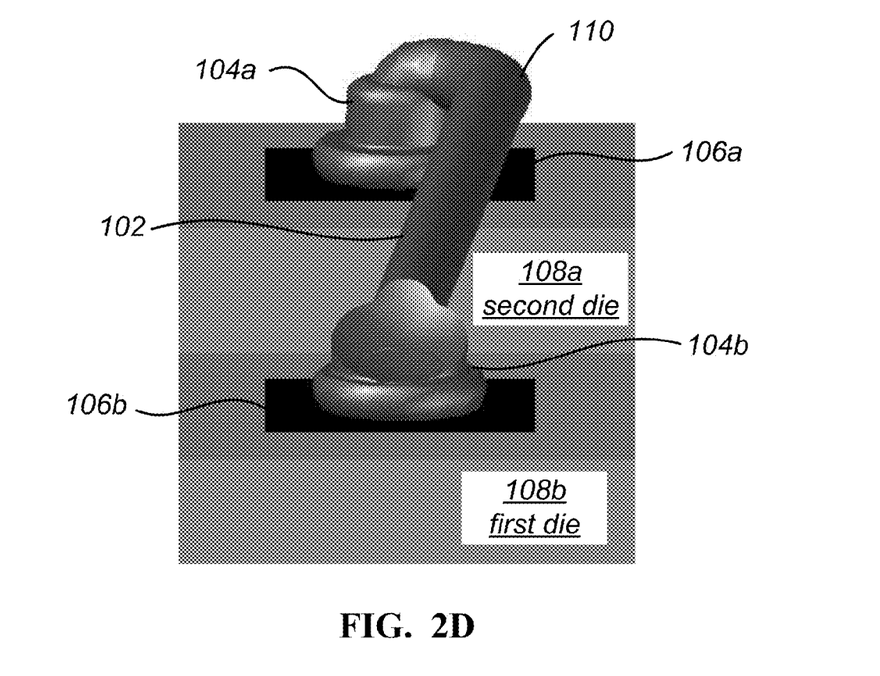

FIG. 2C is from a perspective of point C shown in FIG. 1, and FIG. 2D is from a perspective of point D shown in FIG. 1. In these figures the perspectives are from points slightly above the upper surface of the bond pads 106a, 106b. These figures show the bonding wire 102 extending between the ball bonds 104a, 104b and connecting the bond pads 106a, 106b. The first portion of the bonding wire 102 extends upward from the ball bond 104a substantially along a z-axis and curves outward substantially along x and y axes in a direction toward the semiconductor die 108b. In this example the x-axis extends between the semiconductor dies 108a, 108b, and the y-axis extends perpendicular to the x and z axes. The second portion of the bonding wire extends from the bend 110 nearly straight to the ball bond 104b.

Figure 3A:
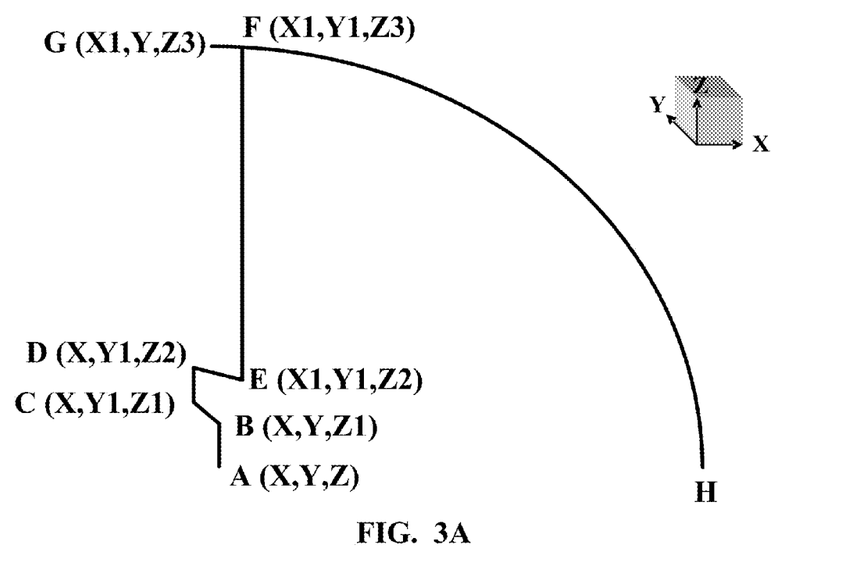
FIGS. 3A-3B are simplified diagrams illustrating paths followed by a capillary during formation of a bonding wire in accordance with an embodiment of the invention.
Figure 3B:
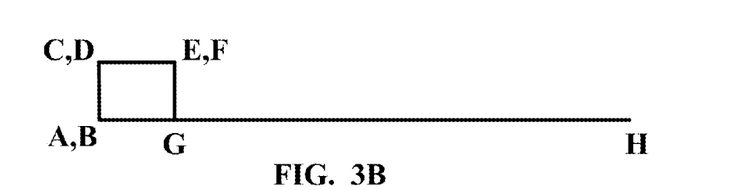

FIGS. 3A-3B are simplified diagrams illustrating a path followed by a capillary during formation of a bonding wire in accordance with an embodiment of the invention. The path may be used to produce a bonding wire having a J-shape similar to that shown in FIG. 4. FIG. 3A shows the path in three-dimensions and includes changes in X, Y, Z directions. FIG. 3B shows movement of the capillary along an X-Y plane when viewed from above (looking in a negative Z direction).

Figure 4:
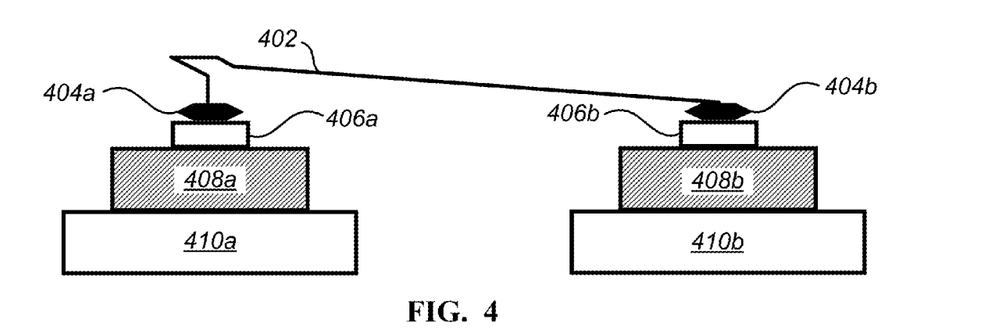
FIG. 4 is a simplified diagram of a bonding wire in accordance with an embodiment of the invention.

As shown in FIG. 4, the bonding wire 402 extends between ball bonds 404a, 404b and electrically connects bond pads 406a, 406b of semiconductor dies 408a, 408b. In this example the semiconductor dies 408a, 408b are positioned on respective die pads 410a, 410b. Note that the bond pads 406a, 406b may not protrude above the upper surfaces of the semiconductor dies 408a, 408b as illustrated in this example.

The bonding wire 402 includes a first portion that extends upward and outward from the ball bond 404a. The bonding wire 402 also includes a second portion that extends downward from the first portion to the ball bond 404B.

FIGS. 5A-5J are simplified diagrams illustrating various positions of a capillary and various shapes of a wire during formation of a bonding wire in accordance with an embodiment of the invention. Each of the points A-H shown in the path illustrated in FIGS. 3A-3B are explained with reference to FIGS. 5A-5J. As shown in this example, the bonding wire is formed between contacts 506a, 506b. The contacts 506a, 506b may be bond pads of semiconductor dies 508a, 508b disposed on die pads 510a, 510b respectively. Upper surfaces of the contacts 506a, 506b are positioned at substantially the same height or level and are thus substantially coextensive. Upper surfaces of the semiconductor dies 508a, 508b are also positioned at substantially the same height or level and are thus also substantially coextensive.

Figure 5A:
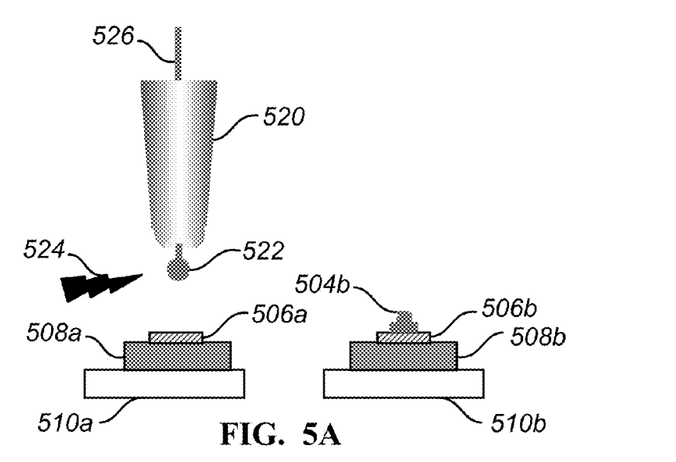
FIGS. 5A-5J are simplified diagrams illustrating various positions of a capillary and various shapes of a wire during formation of a bonding wire in accordance with an embodiment of the invention.

As shown in FIG. 5A, a ball bond 504b may be formed on contact 506b. Details of an exemplary method for forming the ball bond 504b are provided below with reference to FIGS. 6 and 7A-7H. FIG. 5A also shows a wire 526 extending through a capillary 520. The capillary 520 may be part of a larger bonding tool that is not shown for simplicity. A tail of the wire 526 that extends below the capillary 520 is heated and melted using an electric spark 524 in accordance with known techniques. The electric spark 524 is generally referred to as an electric flame off (EFO) and may be generated using an EFO wand (not shown). The EFO melts an end of the wire 526 to form a free air ball (FAB) 522.

Figure 5B:
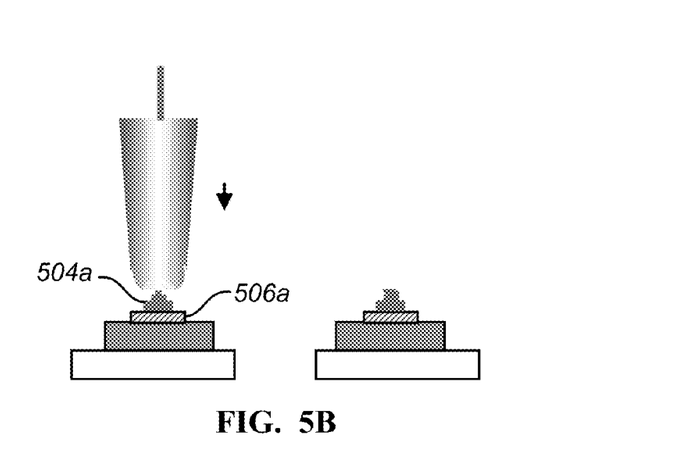

In FIG. 5B, the capillary 520 is moved downward until the FAB 522 comes into contact with contact 506a. Ultrasonic energy and force may be applied in accordance with known techniques to form ball bond 504a on the contact 506a.

Figure 5C:
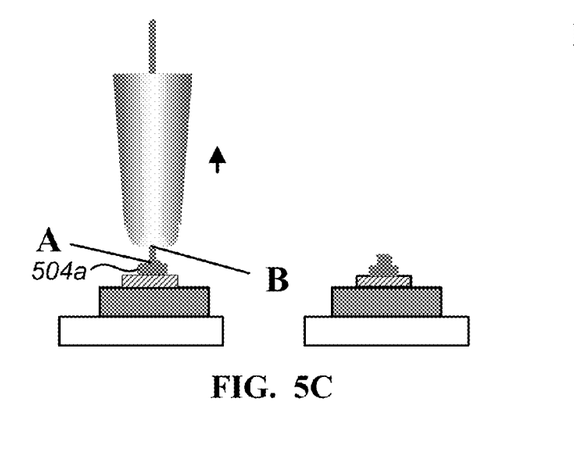

In FIG. 5C, a clamp opens and the capillary 520 is raised vertically upward substantially along a z-axis a first distance from the ball bond 504a. The capillary 520 is raised from point A to point B while paying out a first length of the wire 526 (see FIG. 3A).

Figure 5D:
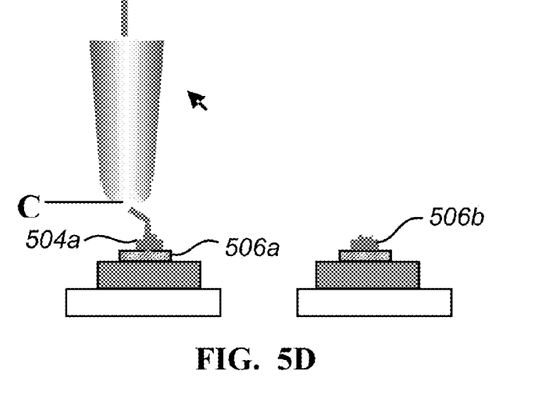

In FIG. 5D, the capillary 520 is moved laterally substantially along a y axis a second distance in a direction away from the ball bond 504a. In this example, an x-axis extends between the contacts 506a, 506b and the y-axis extends perpendicular to the x and z axes. The capillary 520 is moved from point B to point C (see FIGS. 3A-3B).

Figure 5E:
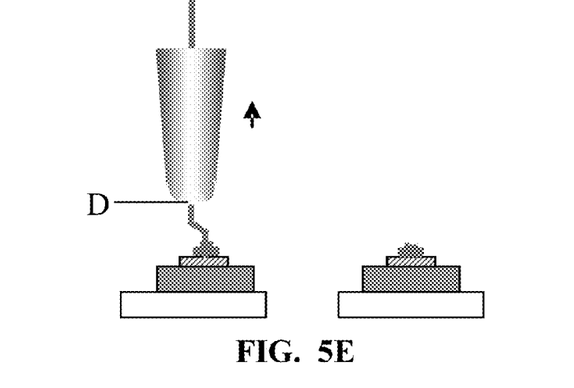

In FIG. 5E, the capillary 520 is raised vertically upward substantially along the z-axis a third distance. The capillary 520 is moved from point C to point D while paying out a second length of the wire 526 (see FIG. 3A).

Figure 5F:
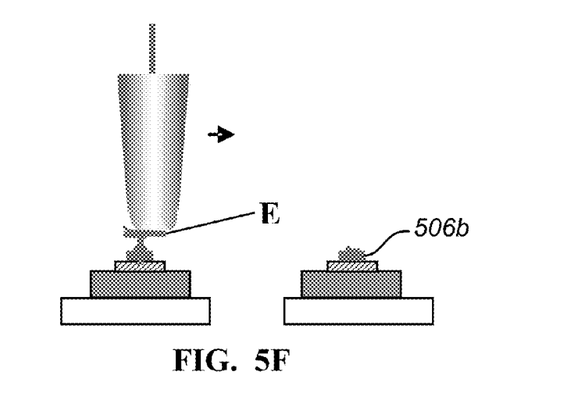

In FIG. 5F, the capillary 520 is moved laterally substantially along the x axis a fourth distance in a direction toward contact 506b. The capillary is moved from point D to point E (see FIG. 3A-3B).

Figure 5G:
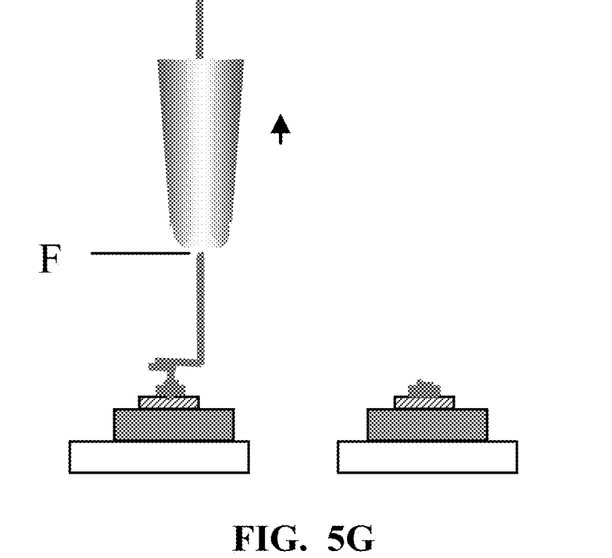

In FIG. 5G, the capillary 520 is raised vertically upward substantially along the z-axis a fifth distance. The capillary 520 is moved from point E to point F (see FIG. 3A).

Figure 5H:
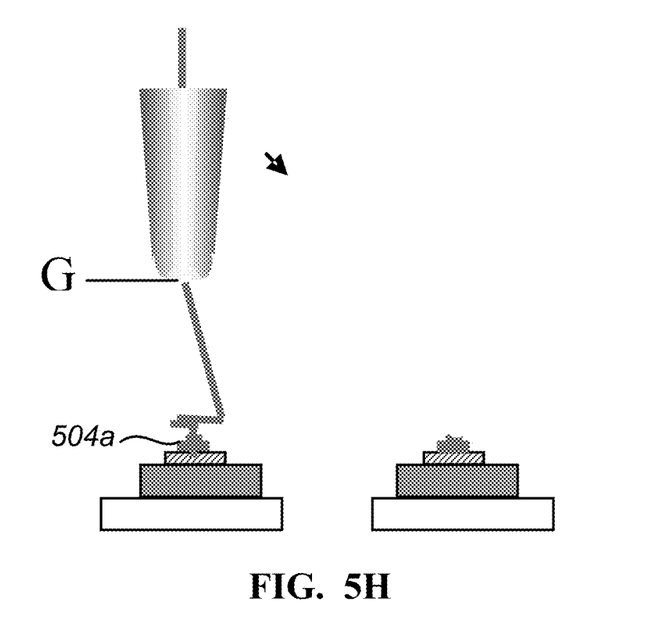

In FIG. 5H, the capillary 520 is moved laterally substantially along the y-axis a sixth distance in a direction towards the ball bond 504a. The capillary 520 is moved from point F to point G (see FIGS. 3A-3B).

Figure 5I:
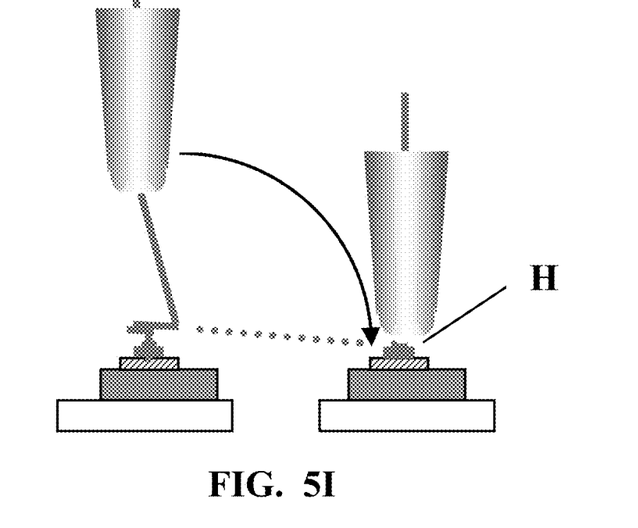

In FIG. 5I, the capillary 520 is moved downward to a position near the bond pad 506b. The capillary 520 is moved from point G to point H (see FIG. 3A-3B). In an embodiment, the clamp within the capillary 520 closes before moving from point G to point H. At point H, the wire 526 may be connected to the ball bond 504b using ball stitch on ball (or wedge) bonding.

Figure 5J:
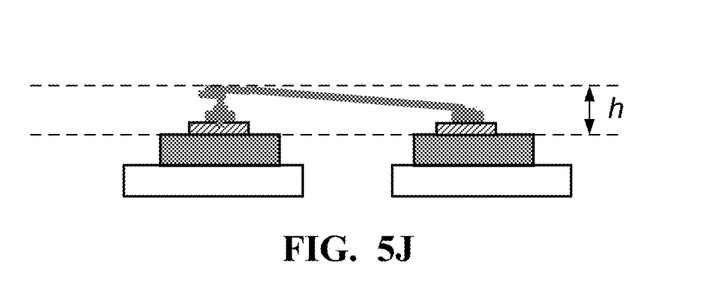

FIG. 5J shows the bonding wire formed by following the steps illustrated in FIGS. 5A-5J. Using these steps, the bonding wire may be formed to have a maximum height (h) of no more than about 50 µm above an upper surface of the contacts 506a, 506b (or a maximum h of no more than about 50 µm above an upper surface of the semiconductor dies 508a, 508b if the contacts 506a, 506b and the semiconductor dies 508a, 508b are at approximately the same level). This compares to a loop height of about 150-200 µm using conventional processes.

Figures 6, 7A:
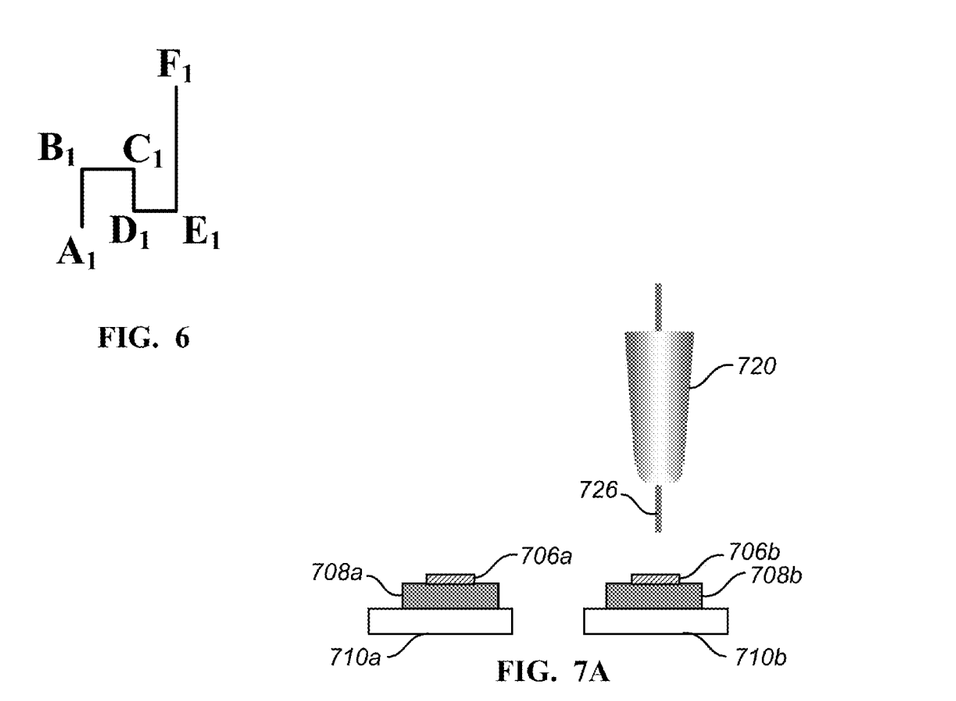
FIG. 6 is a simplified diagram illustrating a path followed by a capillary during formation of a ball bond in accordance with an embodiment of the invention.
FIGS. 7A-7H are simplified diagrams illustrating various positions of a capillary during formation of a ball bond in accordance with an embodiment of the invention.

FIG. 6 is a simplified diagram illustrating a path followed by a capillary during formation of a ball bond in accordance with an embodiment of the invention. The path may be used to produce a ball bond similar to the ball bond 504b shown in FIG. 5A. FIGS. 7A-7H are simplified diagrams illustrating various positions of a capillary during formation of the ball bond in accordance with an embodiment of the invention. Each of the points $A_1$-$F_1$ shown in the path illustrated in FIG. 6 are explained with reference to FIGS. 7A-7H.

FIG. 7A shows a wire 726 extending through a capillary 720. FIG. 7A also shows contacts 706a, 706b. The contacts 706a, 706b may be bond pads of semiconductor dies 708a, 708b disposed on die pads 710a, 710b respectively.

Figure 7B:
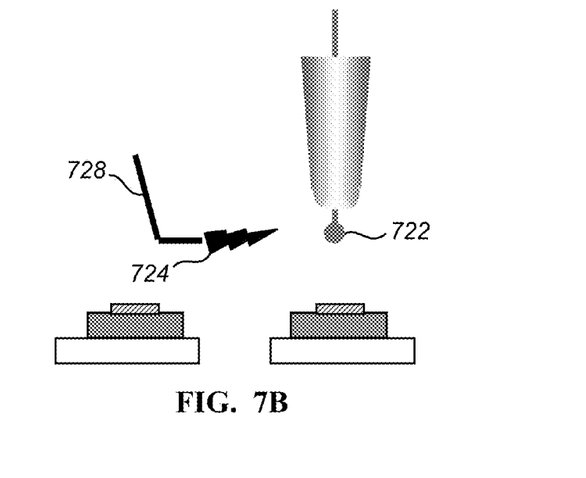

In FIG. 7B, a tail of the wire 726 extending below the capillary 720 is heated and melted using an EFO 724 in accordance with known techniques. The EFO 724 may be generated using EFO wand 728. The EFO melts an end of the wire 726 to form a free air ball 722.

Figure 7C:
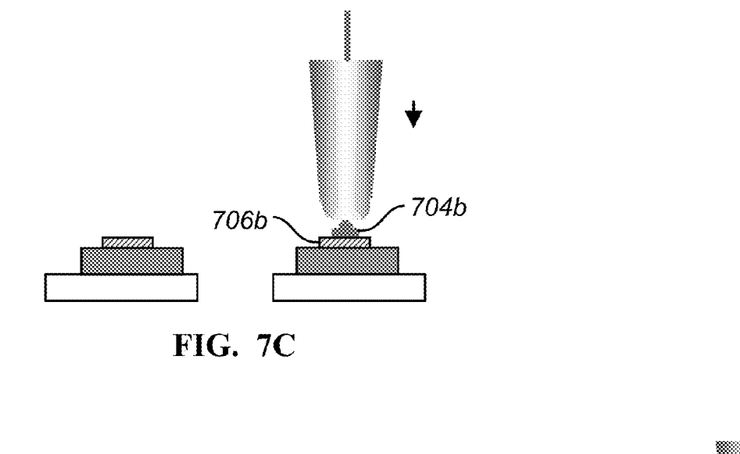

In FIG. 7C, the capillary 720 is moved downward until the FAB 722 comes into contact with the bond pad 706b. Ultrasonic energy and force may be applied in accordance with known techniques to form ball bond 704b on contact 706b.

Figure 7D:
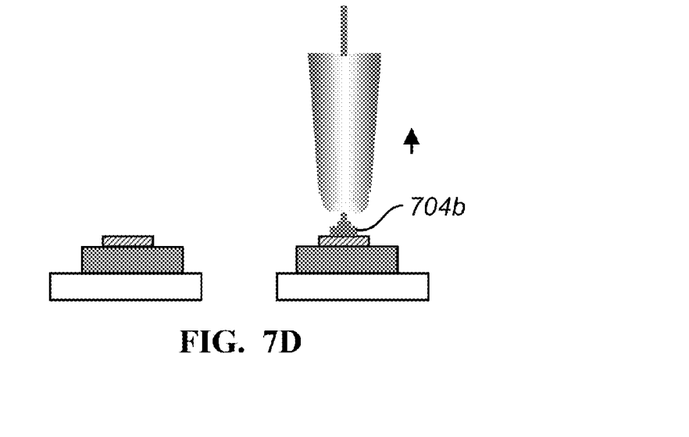

In FIG. 7D, a clamp opens and the capillary 720 is raised substantially vertically upward a first distance. The capillary 720 is raised from point $A_1$ to point $B_1$ (see FIG. 6). The first distance provides sufficient clearance for subsequent movement of the capillary 720.

Figure 7E:
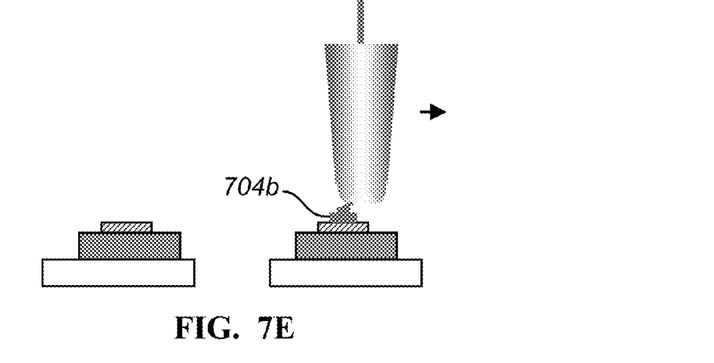

In FIG. 7E, the capillary 720 is moved laterally a second distance to offset from the ball bond 704b. The capillary 720 is moved from point $B_1$ to point $C_1$ (see FIG. 6).

Figure 7F:
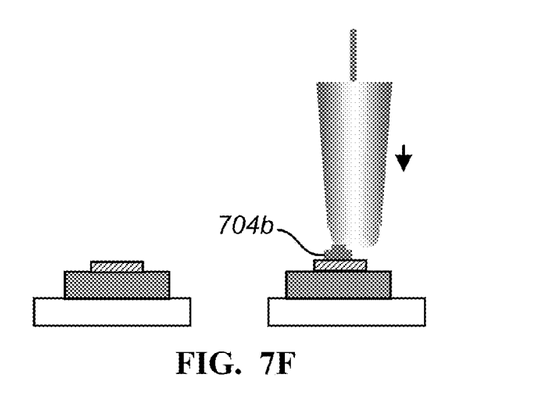

In FIG. 7F, the capillary 720 is moved downward a third distance. The capillary 720 is moved from point $C_1$ to point $D_1$ (see FIG. 6). A stitch or wedge-like bond is formed on top of the ball bond 704b.

Figure 7G:
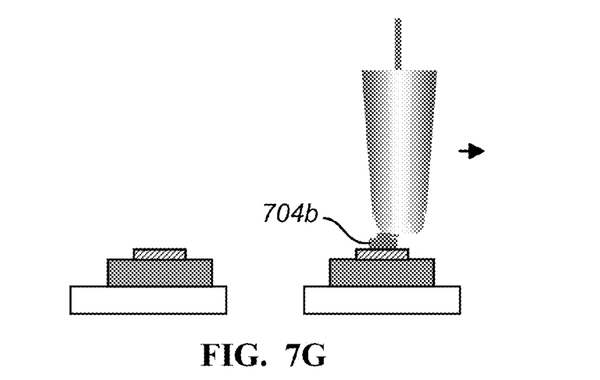

In FIG. 7G, the capillary 720 is moved laterally a fourth distance. The capillary 720 is moved from point $D_1$ to point $E_1$ (see FIG. 6). The wire 726 at a neck of the ball bond 704b may be weakened as the capillary 720 moves from point $B_1$ to point $C_1$ and from point $C_1$ to point $D_1$.

Figure 7H:
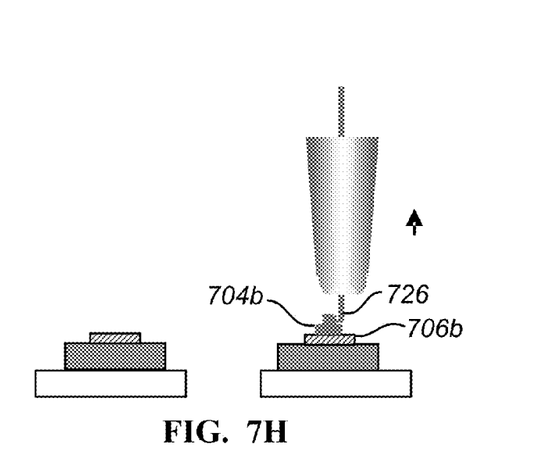

In FIG. 7H, the capillary 720 is raised substantially vertically upward a fifth distance. The capillary 720 is moved from point $E_1$ to point $F_1$ (see FIG. 6). The clamp within the capillary 720 may close, and the wire 726 may be torn from the ball bond 704b leaving the ball bond 704b on the contact 706b.

Figure 8A:
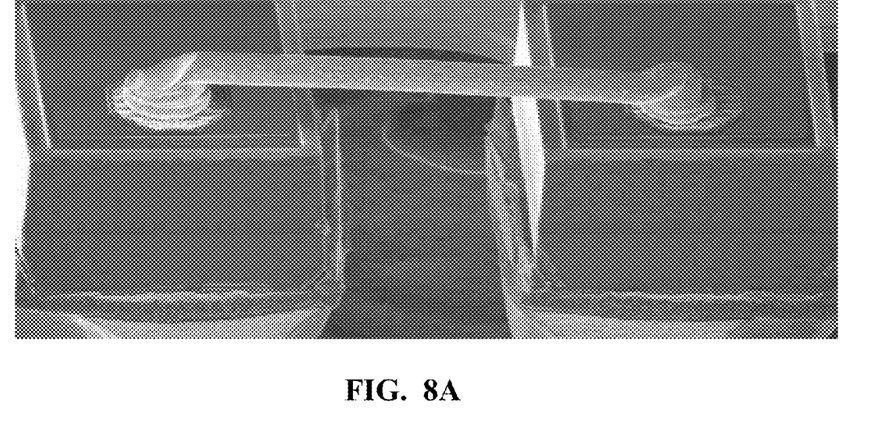
FIGS. 8A-8B are magnified images of an exemplary bonding wire in accordance with an embodiment of the invention.
Figure 8B:
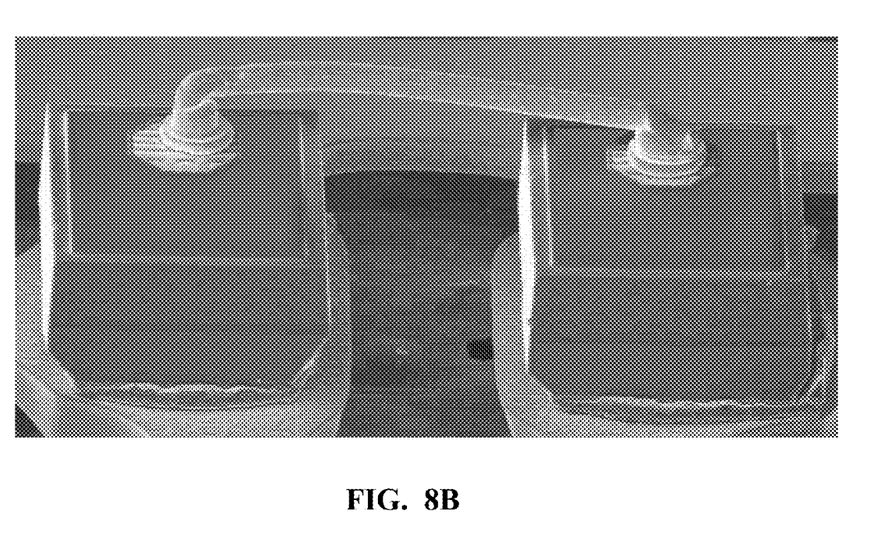

FIGS. 8A-8B are magnified images of an exemplary bonding wire in accordance with an embodiment of the invention. The bonding wire illustrated in this figure may be formed using the steps illustrate in FIGS. 5A-5J and FIGS. 7A-7H. The view in FIG. 8A is from a perspective similar to that of point A shown in FIG. 1, and the view in FIG. 8B is from a perspective similar to that of point B shown in FIG. 1. From these perspectives, the bonding extends between ball bonds on each end and connects bond pads on each semiconductor die. These figures show a first portion of the bonding wire extending upward from a ball bond and curving outward to a bend (near right end of the bonding wire in FIG. 8A and left end of the bonding wire in FIG. 8B). A convex portion of a bend is visible near a right end of the bonding wire in FIG. 8A, and a concave portion of the bend is visible near a left end of the bonding wire in FIG. 8B. A second portion of the bonding wire extends from the bend downward to the other ball bond. In the embodiment shown, one end of the bonding wire is bonded using ball stitch bonding, and the other end of the bonding wire is bonded using ball stitch on ball (or wedge) bonding.

Figure 9:
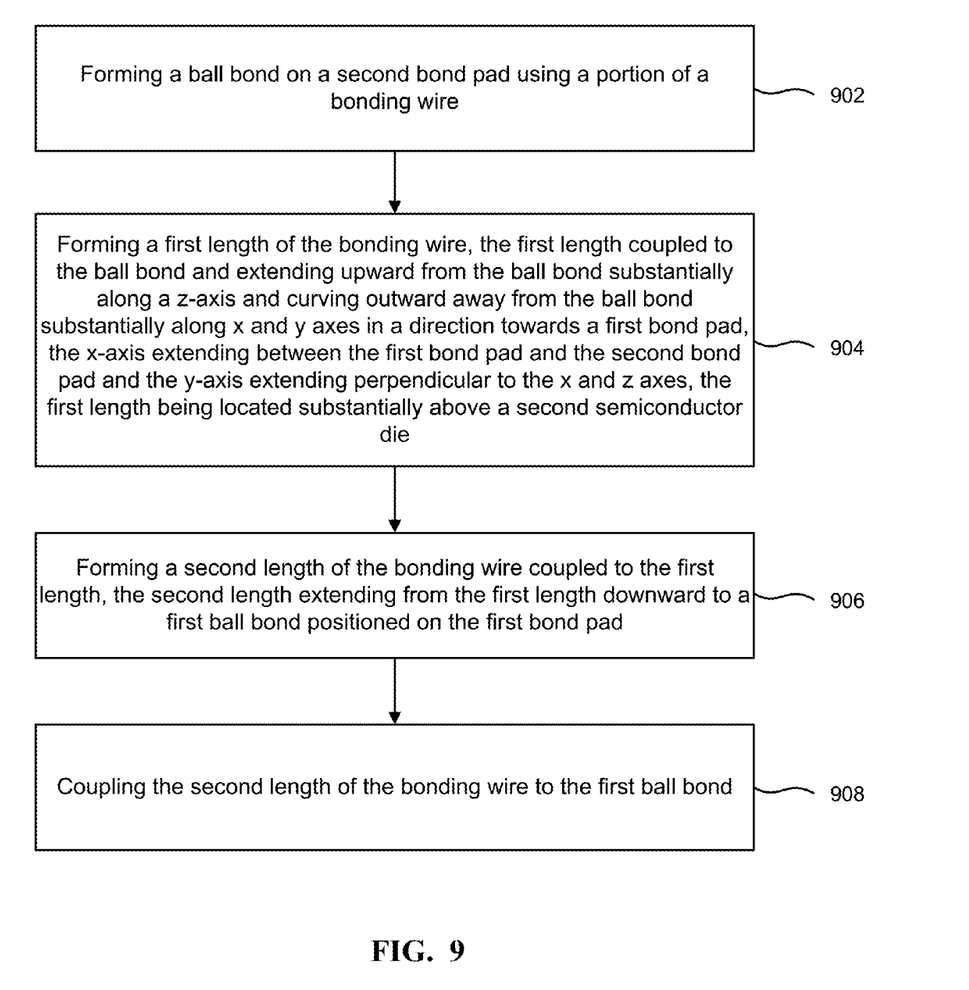
FIG. 9 is a simplified flowchart illustrating an exemplary method of coupling a first end of a bonding wire to a first bond pad and a second end of the bonding wire to a second bond pad in accordance with an embodiment of the invention.

FIG. 9 is a simplified flowchart illustrating an exemplary method of coupling a first end of a bonding wire to a first bond pad and a second end of the bonding wire to a second bond pad in accordance with an embodiment of the invention. An upper surface of the first bond pad may be substantially coextensive with an upper surface of the second bond pad. The method includes forming a ball bond on the second bond pad using a portion of the bonding wire (902). In an embodiment, a first ball bond is formed on the first bond pad prior to forming the ball bond on the second bond pad.

The method also includes forming a first length of the bonding wire, where the first length is coupled to the ball bond and extends upward from the ball bond substantially along a z-axis and curves outward away from the ball bond substantially along x and y axes in a direction towards a first bond pad (904). In this example, the x-axis extends between the first bond pad and the second bond pad and the y-axis extends perpendicular to the x and z axes. The first length may be located substantially above a second semiconductor die. The method also includes forming a second length of the bonding wire that is coupled to the first length, where the second length extends from the first length downward to a first ball bond positioned on the first bond pad (906). The method also includes coupling the second length of the bonding wire to the first ball bond (908). In an embodiment, the fourth length is coupled to the first ball bond using ball stitch on ball (or wedge) bonding.

It should be appreciated that the specific steps illustrated in FIG. 9 provide a particular method of coupling a first end of a bonding wire to a first bond pad and a second end of the bonding wire to a second bond pad in accordance with an embodiment of the present invention. The steps outlined above may be continuously repeated by system software. Other sequences of steps may also be performed according to alternative embodiments. For example, the steps outlined above may be performed in a different order. Moreover, the individual steps illustrated in FIG. 9 may include multiple sub-steps that may be performed in various sequences as appropriate to the individual step. Furthermore, additional steps may be added or removed depending on the particular application.

It should be noted that some embodiments of the present invention may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may be adapted to perform the necessary tasks. The term "computer-readable medium" includes, but is not limited to, portable or fixed storage devices, optical storage devices, sim cards, other smart cards, and various other mediums capable of storing, containing, or carrying instructions or data.

While the present invention has been described in terms of specific embodiments, it should be apparent to those skilled in the art that the scope of the present invention is not limited to the embodiments described herein. For example, features of one or more embodiments of the invention may be combined with one or more features of other embodiments without departing from the scope of the invention. The specification and drawings are, accordingly, to be regarded in an illustrative rather than a restrictive sense. Thus, the scope of the present invention should be determined not with reference to the above description but with reference to the appended claims along with their full scope of equivalents.

What is claimed is:

1. A multi-die package comprising:
   a die pad;
   a first semiconductor die positioned on the die pad, the first semiconductor die including an upper surface having a first plurality of bond pads thereon;
   a second semiconductor die positioned on the die pad, the second semiconductor die including an upper surface having a second plurality of bond pads thereon, the upper surface of the first semiconductor die being substantially coextensive with the upper surface of the second semiconductor die and extending substantially along a plane; and
   a plurality of bonding wires each coupling one of the first plurality of bond pads on the upper surface of the first semiconductor die to a corresponding one of the second plurality of bond pads on the upper surface of the second semiconductor die, a bonding wire of the plurality of bonding wires comprising:
      a first portion extending upward from one of the second plurality of bond pads substantially along a z-axis and curving outward substantially along x and y axes in a direction towards the first semiconductor die, the x-axis extending between the first semiconductor die and the second semiconductor die and the y-axis extending perpendicular to the x and z axes, the first portion located substantially above the second semiconductor die, and
      a second portion coupled to the first portion and extending from the first portion downward to one of the first plurality of bond pads on the upper surface of the first semiconductor die.

2. The multi-die package of claim 1 wherein the second portion extends substantially straight from the first portion downward to one of the first plurality of bond pads on the upper surface of the first semiconductor die.

3. The multi-die package of claim 1 wherein a maximum height of the bonding wire above the plane is along the first portion and is no more than about 50 μm.

4. The multi-die package of claim 1 wherein the die pad comprises a first die pad and a second die pad, the first die pad laterally spaced from the second die pad, the first semiconductor die positioned on the first die pad and the second semiconductor die positioned on the second die pad.

5. The multi-die package of claim 1 wherein a first end of the bonding wire is bonded to a first ball bond using a wedge bond, the first ball bond positioned on one of the first plurality of bond pads on the upper surface of the first semiconductor die.

6. The multi-die package of claim 5 wherein a second end of the bonding wire is bonded to one of the second plurality of bond pads on the upper surface of the second semiconductor die using a second ball bond.

7. The multi-die package of claim 1 wherein a diameter of the bonding wire is no more than about 20 μm.

8. The multi-die package of claim 1 wherein the bonding wire comprises at least one of gold or copper.

9. A semiconductor package comprising:
   a first bond pad on a first upper surface;
   a second bond pad on a second upper surface, the first upper surface being laterally spaced from and substantially coextensive with the second upper surface; and
   a bonding wire having a first end and a second end, the first end of the bonding wire coupled to the first bond pad, and the second end of the bonding wire coupled to the second bond pad, the bonding wire comprising:
      a first portion extending upward from the second bond pad substantially along a z-axis and curving outward away from the second bond pad substantially along x and y axes in a direction towards the first bond pad, the x-axis extending between the first bond pad and the second bond pad and the y-axis extending perpendicular to the x and z axes, the first portion located substantially above the second upper surface, and
      a second portion coupled to the first portion and extending from the first portion downward to the first bond pad.

10. The semiconductor package of claim 9 wherein the second portion extends substantially straight from the first portion downward to the first bond pad.

11. The semiconductor package of claim 9 wherein a maximum height of the bonding wire above the first upper surface and the second upper surface is along the first portion and is no more than about 50 μm.

12. The semiconductor package of claim 9 wherein the first portion is coupled to the second bond pad using a ball bond.

13. The semiconductor package of claim 9 wherein the second portion is coupled to a ball bond positioned on the first bond pad using a wedge bond.

14. The semiconductor package of claim 9 wherein a diameter of the bonding wire is no more than about 20 μm.

15. The semiconductor package of claim 9 wherein the bonding wire comprises at least one of gold or copper.

16. A method of coupling a first end of a bonding wire to a first bond pad on a first semiconductor die and a second end of the bonding wire to a second bond pad on a second semiconductor die, where an upper surface of the first bond pad is substantially coextensive with an upper surface of the second bond pad, the method comprising:
   forming a ball bond on the second bond pad using a portion of the bonding wire;
   forming a first length of the bonding wire, the first length coupled to the ball bond and extending upward from the ball bond substantially along a z-axis and curving outward away from the ball bond substantially along x and y axes in a direction towards the first bond pad, the x-axis extending between the first bond pad and the second bond pad and the y-axis extending perpendicular to the x and z axes, the first length being located substantially above the second semiconductor die;

forming a second length of the bonding wire coupled to the first length, the second length extending from the first length downward to a first ball bond positioned on the first bond pad; and coupling the second length of the bonding wire to the first ball bond.

17. The method of claim 16 wherein the second length extends substantially straight from the first length downward to the first ball bond positioned on the first bond pad.

18. The method of claim 16 further comprising:

prior to forming the ball bond on the second bond pad, forming the first ball bond on the first bond pad; and tearing the bonding wire to separate the bonding wire from the first ball bond.

19. A wire bonding method in which a wire passing through a capillary is coupled to a first bond pad and to a second bond pad, the method comprising the steps of:

forming a ball bond on the second bond pad;

thereafter, while paying out a first length of the wire:

raising the capillary vertically upward substantially along a z-axis a first distance from the ball bond;

thereafter, moving the capillary laterally substantially along a y axis a second distance in a direction away from the ball bond, an x-axis extending between the first bond pad and the second bond pad and the y-axis extending perpendicular to the x and z axes;

thereafter, raising the capillary vertically upward substantially along the z-axis a third distance;

thereafter, moving the capillary laterally substantially along the x axis a fourth distance in a direction towards the first bond pad;

thereafter, raising the capillary vertically upward substantially along the z-axis a fifth distance;

thereafter, moving the capillary laterally substantially along the y-axis a sixth distance in a direction towards the ball bond;

thereafter, moving the capillary downward to the first bond pad; and thereafter, coupling the wire to the first bond pad.

20. The wire bonding method of claim 19 wherein forming the ball bond comprises melting an end of the wire using an electric flame off to form a free air ball.

21. The wire bonding method of claim 19 further comprising:

prior to forming the ball bond on the second bond pad, forming a first ball bond on the first bond pad; and tearing the wire to separate the wire from the first ball bond on the first bond pad.

22. The wire bonding method of claim 21 wherein coupling the wire to the first bond pad comprises forming a wedge bond on the first ball bond.

* * * * *